(12) United States Patent
Zhang et al.

(10) Patent No.: US 10,490,647 B1
(45) Date of Patent: Nov. 26, 2019

(54) METHOD OF FORMING METAL SILICIDE LAYER, SEMICONDUCTOR DEVICE AND METHOD OF FABRICATING SAME

(71) Applicant: Nexchip Semiconductor Corporation, Hefei, Anhui (CN)

(72) Inventors: Yugui Zhang, Anhui (CN); Jianzhi Fang, Anhui (CN); Kangjun Peng, Anhui (CN); Qunzheng Lin, Anhui (CN)

(73) Assignee: NEXCHIP SEMICONDUCTOR CORPORATION, Hefei, Anhui (CN)

( * ) Notice: Subject to any disclaimer, the term of this patent is extended or adjusted under 35 U.S.C. 154(b) by 0 days.

(21) Appl. No.: 16/119,277

(22) Filed: Aug. 31, 2018

(30) Foreign Application Priority Data

Jul. 3, 2018 (CN) .......................... 2018 1 0717248

(51) Int. Cl.
| | |
|---|---|
| *H01L 21/44* | (2006.01) |
| *H01L 29/66* | (2006.01) |
| *H01L 21/3205* | (2006.01) |
| *H01L 21/02* | (2006.01) |
| *H01L 29/45* | (2006.01) |
| *H01L 29/49* | (2006.01) |
| *H01L 21/3213* | (2006.01) |

(52) U.S. Cl.
CPC ...... *H01L 29/665* (2013.01); *H01L 21/02532* (2013.01); *H01L 21/32053* (2013.01); *H01L 29/456* (2013.01); *H01L 21/02068* (2013.01); *H01L 21/32134* (2013.01); *H01L 29/4933* (2013.01); *H01L 29/6656* (2013.01)

(58) Field of Classification Search
CPC ........... H01L 29/4933; H01L 21/02304; H01L 28/75; H01L 23/53209; H01L 29/456
USPC ............... 438/627, 630, 649, 651, 664, 682; 257/750, 754, 757, 768, 769
See application file for complete search history.

(56) References Cited

U.S. PATENT DOCUMENTS

| | | | |
|---|---|---|---|
| 2011/0079793 A1* | 4/2011 | Shimada ................ | C30B 25/183 257/77 |
| 2011/0121309 A1* | 5/2011 | Lee .................... | H01L 21/02488 257/72 |
| 2012/0104461 A1* | 5/2012 | Leitz ....................... | C30B 25/02 257/190 |
| 2014/0027777 A1* | 1/2014 | Lee ........................ | C30B 25/183 257/76 |
| 2015/0061030 A1* | 3/2015 | Uddin ..................... | H01L 29/04 257/369 |

* cited by examiner

*Primary Examiner* — S. V. Clark
(74) *Attorney, Agent, or Firm* — Muncy, Geissler, Olds & Lowe, P.C.

(57) ABSTRACT

A method for forming a metal silicide layer, a semiconductor device and a method for fabricating the device are disclosed. Through depositing a buffer layer between a metal layer and a substrate, metal atoms in the metal layer will diffuse, during a thermal annealing process, through the buffer layer into the substrate while being buffered by the buffer layer. As a result, the diffusion speed and depth of the metal atoms in the substrate are both reduced, and a reaction between the metal and silicon in the substrate is hence slowed down. In this way, the risk of agglomeration of the resulting metal silicide can be effectively lowered, avoiding pinhole defects occurring in the substrate and improving the interface roughness of the resulting metal silicide layer.

17 Claims, 7 Drawing Sheets

METHOD OF FORMING METAL SILICIDE LAYER, SEMICONDUCTOR DEVICE AND METHOD OF FABRICATING SAME

CROSS-REFERENCES TO RELATED APPLICATIONS

This application claims the priority of Chinese patent application number 201810717248.8, filed on Jul. 3, 2018, the entire contents of which are incorporated herein by reference.

TECHNICAL FIELD

The present invention relates to semiconductor technology and, in particular, to a method for forming a metal silicide layer, a semiconductor device and a method for fabricating the device.

BACKGROUND

In modern semiconductor technology, metal silicides, which are generally formed from reactions between metals and silicon, are often used in various semiconductor devices. For example, metal silicides are usually incorporated in transistors to provide low resistance at their gate, source and drain. In particular, with the development of semiconductor technology, semiconductor devices tend to be increasingly integrated and miniaturized, allowing increased ease of use of metal silicides resulting from self-aligned silicide (salicide) processes in the fabrication of semiconductor devices.

FIGS. 1a and 1b schematically illustrate a conventional process for forming a metal silicide layer. This process, for example includes:

providing a substrate 10 which may be a silicon substrate, as shown in FIG. 1a;

depositing a metal layer 20 over the substrate 10, also as shown in FIG. 1a; and performing a thermal annealing process, as shown in FIG. 1b, so that metal (M) atoms diffuse from the metal layer 20 into the substrate 10 and react with silicon (Si) therein to form a metal silicide ($MSi_x$), which constitutes the metal silicide layer 30.

As shown in FIG. 1b, in the above conventional method, the resulting metal silicide layer 30 may extend a relatively great depth into the substrate 10, rendering a great consumption of the substrate 10. Moreover, based on an in-depth analysis of the metal silicide layer, the inventors of the present application have found that agglomeration of the metal silicide ($MSi_x$) tend to occur in the metal silicide layer, which will lead to a number of pinhole defects within the substrate as well as rough surfaces of the metal silicide layer 30, i.e., a rough top surface and a rough interface with the substrate 10.

SUMMARY OF THE INVENTION

It is an object of the present invention to overcome the problem of $MSi_x$ agglomeration occurring during the formation of the metal silicide layer in the conventional method by proposing a novel method for forming a metal silicide layer.

This object is attained by a method for forming a metal silicide layer provided in the present invention, which comprises:

providing a substrate, the substrate comprising silicon;

sequentially depositing a buffer layer and a metal layer over the substrate so that the buffer layer is sandwiched between the metal layer and the substrate; and performing a thermal annealing process to allow metal atoms in the metal layer to diffuse through the buffer layer into the substrate and react with silicon in the substrate to form a metal silicide layer, wherein at least part of a buffer material in the buffer layer passes through the metal layer and migrates above the metal silicide layer.

Optionally, the method may further comprise, subsequent to the deposition of the buffer layer and prior to the deposition of the metal layer, depositing a silicon layer on the buffer layer so that the metal layer is deposited the silicon layer, and wherein during the thermal annealing process, part of the metal atoms in the metal layer reacts with silicon in the silicon layer, while another part of the metal in the metal layer diffuses into the substrate and reacts with silicon in the substrate, so as to collectively form the metal silicide layer.

Optionally, the metal silicide layer may comprise a first portion and a second portion, a first portion embedded within the substrate and a second portion located above both the first portion and the substrate, wherein the metal layer has a first thickness and the first portion of the metal silicide layer has a second thickness, and wherein a ratio between the first thickness and the second thickness is equal to or greater than 1:3.7.

Optionally, the method may further comprise, subsequent to the deposition of the metal layer and prior to the performance of the thermal annealing process, depositing a capping layer on the metal layer, the capping layer being configured to isolate the metal layer from oxygen-containing particles.

Optionally, the capping layer may comprise titanium nitride.

Optionally, the buffer layer may comprise titanium which constitutes a titanium layer.

Optionally, the titanium layer in the buffer layer may be doped with nitrogen ions. In the nitrogen-doped titanium layer in the buffer layer, a ratio between nitrogen atoms and titanium atoms may be equal to or lower than 10%.

Optionally, the metal layer may comprises cobalt, nickel or tantalum.

Optionally, performing the thermal annealing process to form the metal silicide may comprise:

performing a first thermal annealing process to make the metal atoms in the metal layer to react with the silicon to form an intermediate product of metal silicide, which constitutes an intermediate product layer; and performing a second thermal annealing process at an annealing temperature higher than an annealing temperature of the first thermal annealing process to further silicidate the intermediate product layer into the metal silicide layer, wherein the metal silicide layer has a silicon content higher than a silicon content of the intermediate product layer.

Optionally, during the first thermal annealing sub-process, at least part of the buffer material in the buffer layer may pass through the metal layer and migrate above the metal silicide layer, wherein the method further comprises, subsequent to the first thermal annealing process, removing the buffer material that has migrated above the metal silicide layer.

Optionally, the annealing temperature of the first thermal annealing process may range from 500° C. to 600° C.

Optionally, the annealing temperature of the second thermal annealing process may range from 650° C. to 900° C.

Optionally, the buffer layer may comprise a metal having a lattice structure.

It is another object of the present invention to provide a method for fabricating a semiconductor device, which comprises forming a metal silicide layer using the method as described above.

Optionally, the semiconductor device may comprise a transistor, wherein the metal silicide layer is formed over a gate, a source and a drain of the transistor.

Based on the above method, the present invention also provides a semiconductor device comprising: a substrate comprising silicon; and a metal silicide layer formed on the substrate and embedded therein with conductive particles.

In the metal silicide layer formation method according to the present invention, the buffer layer interposed between the metal layer and the substrate avoids the substrate from providing abundant silicon to the metal layer. With this buffer layer, during the thermal annealing process, the diffusion speed and depth of metal atoms from the metal layer into the substrate can be reduced, thereby avoiding non-uniform nucleation of a large number of crystals of the metal silicide (i.e., agglomeration of the metal silicide) due to an excessively high rate at which the metal reacts with the silicon to produce the metal silicide. In other words, the method of the present invention can mitigate the problem of non-uniform nucleation that may result in bulky crystals of the metal silicide and can hence effectively prevent many pinhole defects occurring in the substrate. In addition, the surface roughness of the resulting metal silicide layer (including both its top surface located away from the substrate and its interface with the substrate) may also be improved. This is helpful in reducing the resistance of the metal silicide layer and leakage currents between the metal silicide layer and the substrate.

Therefore, when the metal silicide layer formation method is applied to the fabrication of a semiconductor device, there will not be many pinhole defects in the substrate after the metal silicide layer is formed, thus ensuring low resistance of a corresponding portion of the semiconductor device to the metal silicide layer. Meanwhile, as the resulting metal silicide layer have much improved surface roughness and its interface with the substrate is neat and flat, the semiconductor device will suffer from less leakage currents.

LIST OF REFERENCE NUMERALS

Figure 1A:
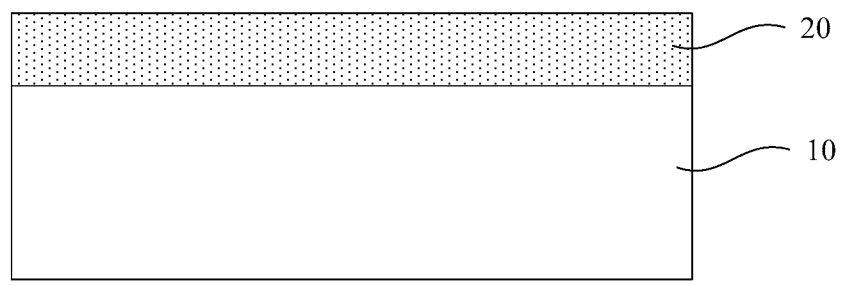
FIGS. 1a and 1b schematically illustrate a conventional process for forming a metal silicide layer.
Figure 1B:

10 Substrate
20 Metal layer
30 Metal silicide layer
100/200 Substrate
110/210 Buffer layer
111 Buffer material
120/220 Silicon layer
130/230 Metal layer
131 Metal atoms
140/240 Capping layer
150a/250a Intermediate product layer
150/250 Metal silicide layer
151 First portion
152 Second portion
200G Gate
200I Spacer
200S Source
200D Drain

DETAILED DESCRIPTION OF EXEMPLARY EMBODIMENTS

As stated in the Background section, the conventional method tends to suffer from great consumption of the substrate and $MSi_x$ agglomeration during the formation of the metal silicide layer. Additionally, the agglomeration can lead to rough surfaces of the metal silicide layer (including its external surface and the internal interface with the substrate) and many pinhole defects in the substrate. This is unfavorable to the subsequent processes to be performed on the metal silicide layer and may cause an increase in electrical resistance of the metal silicide layer and significant leakage currents therein.

Through intensive research, the inventors of the present application have identified a possible cause for $MSi_x$ agglomeration occurring during the formation of the metal silicide layer in the conventional method. Under given conditions, metal atoms in the metal layer can rapidly diffuse and react with silicon. In addition, since the metal layer is directly deposited on the substrate which is an abundant silicon source, rapid nucleation will take place during the reaction and result in large metal silicide ($MSi_x$) crystals. As a result, the substrate will be greatly consumed, in general at a rate of about 3.7 thickness units per thickness unit of the metal layer. Further, the non-uniform nature of the rapid nucleation and the large size of the resulting crystals are direct causes of the pinhole defects and the rough surfaces of the metal silicide layer.

To this end, the present invention provides a method for forming a metal silicide layer, in which a buffer layer is formed on a substrate and a metal layer is in turn formed on the buffer layer. In this way, direct contact between the metal layer and the substrate is avoided, thus reducing the diffusion speed and depth of the metal atoms into the substrate and ensuring stable formation of the metal silicide under mild conditions for the reaction between the metal and silicon. As a result, the nucleation uniformity will be improved because of the moderate formation of the metal silicide, and all of the above problems will be mitigated, i.e., pinhole defects in the substrate, rough surfaces of the metal silicide layer, high resistance of the metal silicide layer and large leakage currents between the metal silicide layer and the substrate.

The present invention will be described below in further detail with reference to the accompanying drawings and specific embodiments. Features and advantages of the invention will be more apparent from the following detailed description. It is noted that the figures are provided in a very simplified form not necessarily presented to scale, with the only intention to facilitate convenience and clarity in explaining embodiments of the present invention.

Embodiment 1

Figure 2:
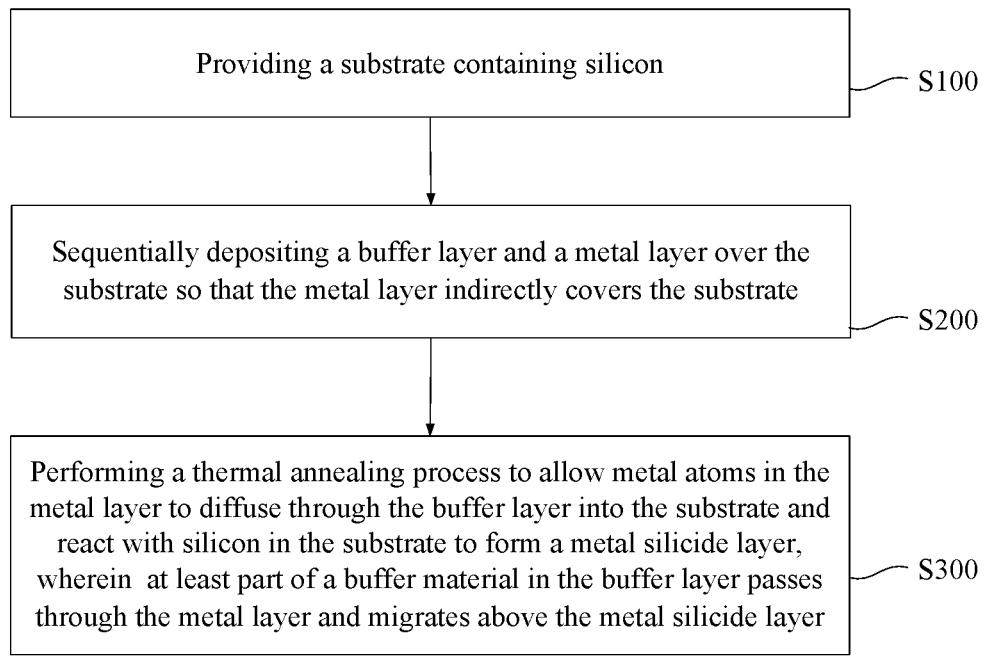
FIG. 2 is a flow chart graphically illustrating a method for forming a metal silicide layer according to a first embodiment of the present invention.

FIG. 2 is a flow chart graphically illustrating a method for forming a metal silicide layer according to a first embodiment of the present invention, and FIGS. 3a to 3e are schematic diagrams showing structures during the formation of the metal silicide layer in the method. Steps in the method for forming the metal silicide layer will be detailed below with reference to these figures.

Figure 3A:
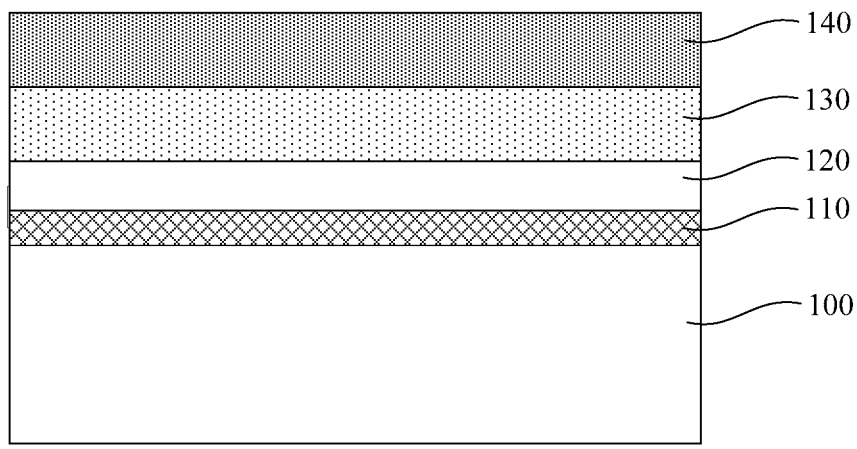
FIGS. 3a to 3e are schematic diagrams showing structures during the formation of the metal silicide layer according to the first embodiment of the present invention.

In step S100, with reference to FIG. 3a, a substrate 100 containing silicon is provided. For example, the substrate 100 may be a silicon substrate or a silicon germanium (SiGe) substrate. Under given conditions, silicon (chemical formula: Si) in the substrate 100 can react with a metal (chemical formula: M) in a subsequently deposited metal layer to form a metal silicide (chemical formula: $MSi_X$). The silicon in the substrate 100 may either be polycrystalline silicon (c-Si) or non-crystalline silicon (a-Si) without departing from the scope of the present invention.

As noted above, a metal layer will be deposited on the substrate 100 in a subsequent process. Of course, other layers than the metal layer may also be formed on the substrate 100 according to this embodiment. In a preferred embodiment, prior to the subsequent formation of the layers, the substrate 100 may be cleaned to remove contaminants, oxides or the like on the surface of the substrate 100.

It is noted that, according to this embodiment, the cleaning of the substrate 100 is not only for enhancing the cleanness of the substrate surface but also for facilitating the performance of the subsequent processes. Moreover, with so cleaned surface of the substrate, during the subsequent formation of the metal silicide from the reaction between the metal and silicon in the substrate, agglomeration due to growth of $MSi_X$ crystals with contaminating particles as the nuclei will be avoided. The cleaning of the substrate 100 further allows a uniform interface energy distribution between the substrate 100 and the subsequent layers, which can avoid non-uniform nucleation of $MSi_X$ crystals caused by local interface energy hotspots.

Additionally, the substrate may be cleaned with a cleaning agent which, for example, contains diluted hydrofluoric acid (DHF) or a buffered oxide etchant (BOE). In particular, the BOE may be a mixture of a hydrofluoric acid (HF) solution and an ammonium fluoride ($NH_4F$) solution.

In an optional embodiment, a period of delay from the cleaning to the subsequent formation of the layers may be controlled. That is, the layers are formed within a predetermined period of time after the substrate is cleaned so as to ensure that the layers are formed on the surface of the substrate with higher cleanness. The layers may be formed within 8 hours after the cleaning is completed so that the substrate can have higher cleanness without being naturally oxidized.

In step S200, with continued reference to FIG. 3a, on the substrate 100 are sequentially deposited a buffer layer 110 and a metal layer 130 so that the buffer layer 110 is sandwiched between the metal layer 130 and the substrate 100.

In other words, the buffer layer 110 separates the metal layer 130 from the substrate 100 so that they do not contact each other directly and the substrate 100 will not serve as a direct, abundant silicon source for the metal layer 130. As a result, the metal in the metal layer 130 reacts with silicon in the substrate 100 at a reduced rate, and under the action of the buffer layer 110, the diffusion of metal atoms from the metal layer 130 into the substrate 100 and within the substrate 100 becomes much slower and affects a shorter depth. This can avoid the problems arising from an excessively high reaction speed between the metal and silicon. Additionally, as a result of the reduced reaction speed between the metal and silicon, the problem of $MSi_X$ agglomeration and hence that of many pinhole defects in the substrate will be mitigated.

It will be appreciated that the buffer layer 110 does not completely block the diffusion of metal atoms from the metal layer 130 into the substrate 100. Rather, it slows the diffusion of metal atoms into the substrate and also slows the diffusion of metal atoms within the substrate. Thus, the buffer layer 110 may be formed of a material having a lattice structure allowing passage of metal atoms from the metal layer 130 through gaps between lattices of the buffer layer 110. For example, the buffer layer 110 may be formed of a metallic material having a lattice structure. In particular, the metallic material of the buffer layer 110 may include titanium (Ti) which constitutes a Ti layer having a lattice structure. In an alternative embodiment, the Ti layer in the buffer layer 110 may be doped with nitrogen ions. It is considered that the Ti layer doped with nitrogen ions constitutes a titanium nitride layer (chemical formula: $TiN_X$). The doped nitrogen ions impart higher compactness of the Ti layer and hence higher strength of the buffer layer 110.

In addition, the buffer layer 110 can isolate, from below the metal layer 130, oxygen-containing particles that may oxidize the metal layer 130.

Specifically, oxygen-containing particles may be present in the substrate 100 or remain from any process prior to the deposition of the buffer layer 110 and can easily oxidize the metal layer 130. Therefore, in the conventional method, as the metal layer is directly deposited on the substrate, oxidization of the metal layer tends to occur at its interface with the substrate to result in an oxide layer which will impede the diffusion of metal ions into the substrate and harm the formation of the metal silicide. In addition, the oxide layer may provide nuclei for non-uniform nucleation in the subsequent formation of the metal silicide, which can roughen the interface between the metal silicide layer and the substrate, leading to high resistance of the metal silicide layer and high leakage currents.

In contrast to the convention method, the buffer layer 110 disposed between the metal layer 130 and the substrate 100 according to this embodiment can effectively block the invasion of oxygen-containing particles from blow the metal layer 130. This can result in an improvement in the quality of the subsequently formed metal silicide layer and can, in particular, protect the portion of the metal layer 130 close to the substrate from being oxidized.

The buffer layer 110 may directly isolate the oxygen-containing particles in a physical manner or by chemically absorbing them through a chemical action. Specifically, crystals of the material of the buffer layer may have chemical bonds for bonding with the oxygen-containing particles which allow trapping of the particles in a chemical way.

In this embodiment, the material of the buffer layer 110 may contain a Ti layer doped with nitrogen ions (i.e., $TiN_X$). In this case, the nitrogen content in the Ti layer may be so controlled to allow the layer to be able to strongly absorb or trap the oxygen-containing particles to prevent them from passing through the buffer layer 110 to react with the metal layer 130. That is, the nitrogen content in the Ti layer is controlled within a predetermined range allowing the Ti layer to establish chemical bonds for bonding with the oxygen-containing particles. It will be appreciated that the nitrogen content of the buffer layer 110 may be determined based on a tradeoff between compactness of the buffer layer 110 and the ability to isolate the oxygen-containing particles. For example, in a particular embodiment, a ratio of nitrogen atoms to titanium atoms in the nitrogen-doped Ti layer ($TiN_x$) is equal to or lower than 10% (i.e., X≤0.1 in the $TiN_x$).

In addition, buffering strength of the buffer layer 110 for metal atoms in the metal layer 130 may also be adjusted by changing the thickness of the buffer layer 110. Coupled with adjusting the buffering strength of the buffer layer 110 through changing the thickness of the buffer layer 110, the metal atoms may pass through the buffer layer 110 at a predetermined rate. For example, the thickness of the buffer layer 110 may range from 10 angstroms (Å) to 40 Å.

Further, the material of the metal layer 130 may be selected according to the practically-needed metal silicide layer. For example, if the needed metal silicide ($MSi_x$) is nickel silicide ($NiSi_2$), tantalum silicide ($TaSi_2$) or cobalt silicide ($CoSi_2$), the material of the metal layer 130 may be accordingly selected as nickel (Ni), tantalum (Ta) or cobalt (Co), respectively.

Among the metals mentioned above, cobalt (Co) has found extensive use in the practical manufacturing of modern semiconductor devices (e.g., in the fabrication of contact pads) because both cobalt and silicon (Si) belong to the cubic crystal system and cobalt silicide ($CoSi_2$) has low sheet resistance and good thermal stability. For this reason, this embodiment will be explained below with the formation of cobalt silicide ($CoSi_2$) as an example. That is, the material of the metal layer 130 according to this embodiment includes cobalt (Co), and a thickness of the metal layer 130 may be determined by a thickness of the metal silicide layer to be formed subsequently. In this embodiment, the thickness of the metal layer 130 may range from 70 Å to 160 Å.

With continued reference to FIG. 3a, in a preferred embodiment, a silicon layer 120 is additionally deposited on the buffer layer 110. The silicon layer 120 can serve as a secondary silicon source to provide silicon for reaction with the metal and hence reduce the consumption of the substrate 100 during the formation of the metal silicide.

Thus, in this embodiment, the metal layer 130 overlies the silicon layer 120 which in turn overlies the buffer layer 110. In this way, under given conditions (e.g., during a thermal annealing process for allowing the metal to react with the silicon), the metal in the metal layer 130 may be caused to react with silicon in the silicon layer 120 with higher priority, resulting an additional decrease in the consumption of the substrate 100. Optionally, the silicon layer 120 may have a thickness ranging from 20 Å to 50 Å.

It is noted that in this embodiment, the silicon layer 120 can not only reduce the consumption of the substrate but is also able to mitigate the problems of metal silicide agglomeration and pinhole defects in the substrate.

Specifically, in the conventional method, as the metal in the metal layer react only with silicon in the substrate, the resulting metal silicide is formed solely in the substrate, which tends to cause agglomeration of the metal silicide and hence many pinhole defects in the substrate during the formation of the metal silicide layer. In contrast, in this embodiment, a part of the metal in the metal layer 130 reacts with silicon in the silicon layer 120 so that the resulting portion of metal silicide layer is located above the substrate 100, while another part of the metal in the metal layer 130 reacts with silicon in the substrate so that another resulting portion of metal silicide layer is located in the substrate 100. That is, in this embodiment the resulting metal silicide layer is only partially located in the substrate 100. This can reduce the risk of metal silicide agglomeration and hence of pinhole defects occurring in the substrate. With continued reference to FIG. 3a, in a preferred embodiment, a capping layer 140 is further formed over the metal layer 130. The capping layer 140 is configured to protect the metal layer 130 from being oxidized by oxygen-containing particles coming from above the metal layer 130.

With similarity to the buffer layer 110, the capping layer 140 may also directly isolate the oxygen-containing particles in a physical manner or by chemically absorbing them through a chemical action. For example, lattices of the material of the capping layer 140 may have chemical bonds for bonding with the oxygen-containing particles which allow trapping of the particles in a chemical way.

In a particular embodiment, the material of the capping layer 140 may also contain titanium nitride ($TiN_x$), and the nitrogen content therein may be selected to ensure satisfactory ability of the capping layer 140 to trap oxygen-containing particles. For example, a ratio of nitrogen atoms to titanium atoms in titanium nitride ($TiN_x$) in the capping layer 140 may be equal to or lower than 10% (i.e., X≤0.1 in the $TiN_x$).

Further, in this embodiment, the capping layer 140 directly covering the metal layer 130 can act on the activation energy of the metal in the metal layer 130, making it possible to exert further control over the speed of the reaction between the metal and silicon. Here, the term "activation energy" refers to an energy necessary for the metal to transition from a normal state to an active state in which it is easy to react with silicon.

In step S300, with reference to FIGS. 3b to 3e, thermal annealing processes are performed to cause metal atoms 131 in the metal layer 130 to pass through the buffer layer 110 and diffuse into the substrate 100 to react with silicon therein, thereby resulting in a metal silicide layer 150. At the same time, at least part of the material 111 of the buffer layer 110 diffuses upward through the metal layer 130 to a location above the resulting metal silicide layer 150.

In this embodiment, as the buffer layer 110 and the metal layer 130 are intervened by the silicon layer 120, during the thermal annealing processes, part of the metal in the metal layer 130 reacts with silicon in the silicon layer 120 to form metal silicide, and another part of the metal in the metal layer 130 passes through the buffer layer 110 and diffuses into the substrate 100 where it reacts with silicon to form metal silicide. All the resulting metal silicide constitutes the metal silicide layer 150.

Figure 3B:
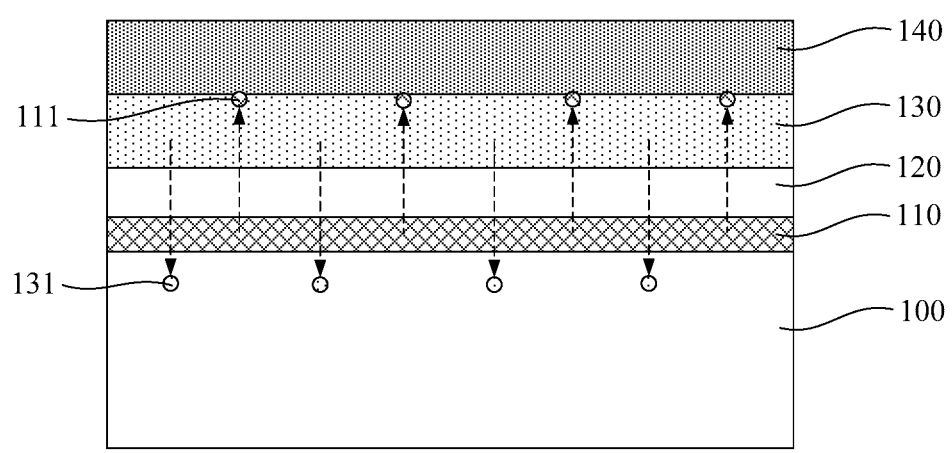
Figure 3C:
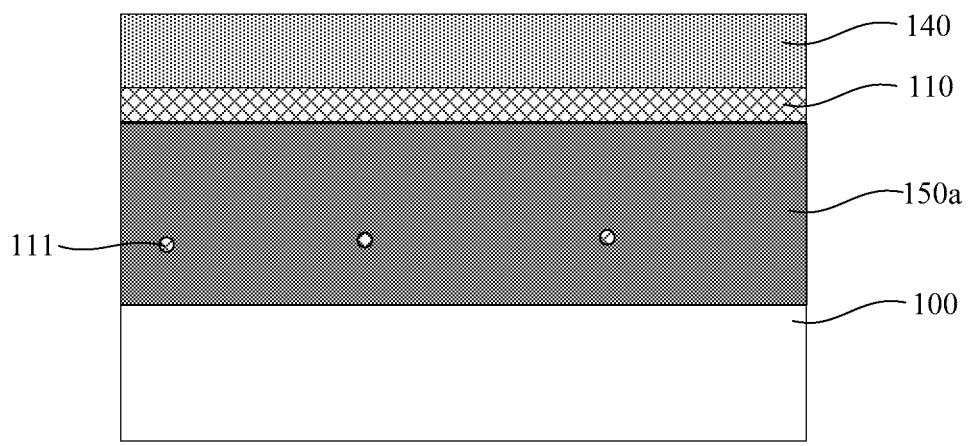

With particular reference to FIGS. 3b and 3c, during the thermal annealing processes, metal atoms 131 in the metal layer 130 pass through the buffer layer 110, i.e., migrating into the substrate underlying the buffer layer 110. Here, it can be appreciated that, at the same time, the buffer material 111 of the buffer layer 110 at least partially migrates, in an opposite direction, through the metal layer 130 to a location above the metal layer 130. That is, concurrently with the migration of metal atoms 131 from the metal layer 130 through the buffer layer 110, at least part of the buffer material 111 of the buffer layer 110 passes through the metal layer 130. As a result, after the thermal annealing processes are completed, the buffer layer 110 is substantially displaced above the metal silicide layer 150. Of course, it is also possible that a minor part of the buffer material 111 of the buffer layer 110 does not migrate above the metal silicide layer 150 and is therefore finally embedded within the metal silicide layer 150.

In this embodiment, the material of the buffer layer 110 contains titanium lightly doped with nitrogen. As titanium is active under the high-temperature condition created during the thermal annealing and can actively pass through the silicon layer 120 and the metal layer 130, it is finally located above the metal silicide layer 150. In addition, it is noted that the upward displacement of the buffer layer 110 during the thermal annealing processes takes place under effect of both passive upward diffusion of titanium from the buffer layer 110 driven by the downward diffusion of metal atoms 131 from the metal layer 130 and active upward diffusion of titanium from the buffer layer 110 under the high-temperature condition.

Further, in this embodiment, when part of the material of the buffer layer 110 that contains titanium lightly doped with nitrogen remains and does not migrate above the metal silicide layer 150, an elemental analysis on the resulting metal silicide layer 150 will find residual titanium. It will be appreciated that, since the residuals of the buffer material 111 embedded in the metal silicide layer 150 are electrically conductive particles, they will not adversely affect the resistance of the resulting metal silicide layer 150.

Further, the step of forming the metal silicide layer 150 by performing the thermal annealing processes to cause the metal in the metal layer 130 to react with silicon may in particular include the following sub-steps:

In sub-step 1, with particular reference to FIGS. 3b and 3c, a first thermal annealing process is performed to cause the metal in the metal layer 130 to react with silicon in the silicon layer and in the substrate so that an intermediate product layer 150a is formed. In other words, in this sub-step, the reaction of the metal (M) and silicon (Si) results into an intermediate product (MSi$_Y$) of the silicidation of the metal, which forms the intermediate product layer 150a.

In this embodiment, the first thermal annealing sub-process is performed at a relatively low temperature (for example, the annealing temperature may range from 500 □ to 600 □) in order to avoid the reaction between the metal and silicon from proceeding too fast and enable the formation of the intermediate product (MSiY) from incomplete silicidation of the metal at such a moderate reaction rate. Examples of the intermediate product may include cobalt monosilicide (CoSi), dicobalt silicide (CoSi$_{1/2}$), etc. In order to avoid oxidization of the metal during the first thermal annealing sub-process, the process may be performed in an atmosphere of an inert gas such as, for example, nitrogen (N$_2$), argon (Ar) or the like.

Furthermore, as described above, the capping layer 140 overlying the metal layer 130 helps suppress the activity of the metal in the metal layer 130 in reaction with silicon by acting on its activation energy. Moreover, the capping layer 140 helps flatten the interfaces of the intermediate product layer 150a. Specifically, under stress from the capping layer 140, agglomeration or non-uniform nucleation that can lead to large crystal particles less occurs and the interface of the resulting intermediate product layer 150a is flatter.

With continued reference to FIG. 3b, during the first thermal annealing sub-process for forming the intermediate product, the buffer material 111 in the buffer layer 110 migrates upwardly and is eventually displaced above the resulting intermediate product layer 150a. FIG. 3c schematically illustrates a minor fraction of the buffer material 111 remaining within the intermediate product layer 150a.

Figure 3D:
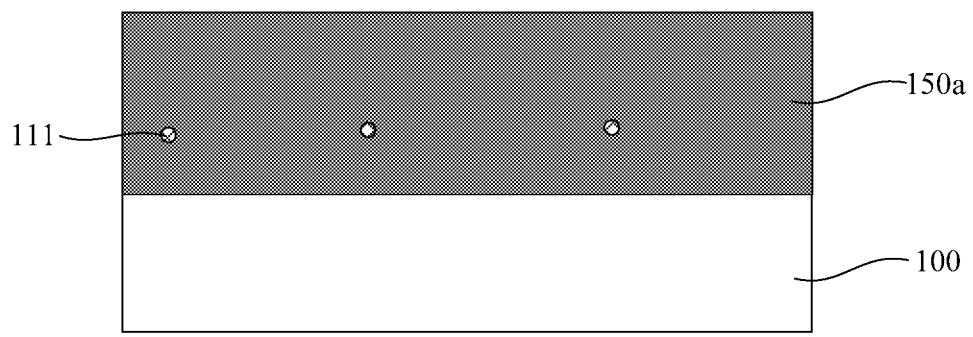

In sub-step 2, with reference to FIG. 3d, in an alternative embodiment, subsequent to the formation of the intermediate product layer 150a, the capping layer 140 and the buffer layer 110 that has migrated above the intermediate product layer 150a may be stripped away. Additionally, the remainder of the metal layer that has not reacted with silicon may also be removed.

In particular, a wet etching process may be employed to remove the capping layer 140 and the buffer layer 110. In this embodiment, an etchant is used in the wet etching process, such as, an SC1 cleaning agent, an SC2 cleaning agent or a combination thereof. Here, the SC1 cleaning agent contains a mixture of an ammonia (NH$_4$OH) solution and hydrogen peroxide (H$_2$O$_2$), and the SC2 cleaning agent contains a mixture of hydrochloric acid (HCl) and hydrogen peroxide (H$_2$O$_2$).

Figure 3E:
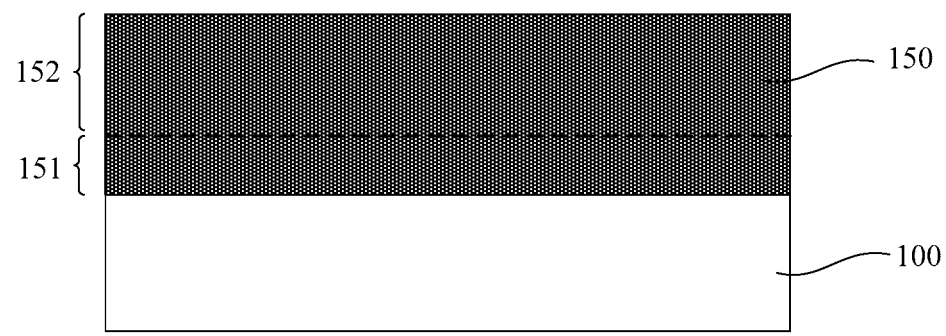

In sub-step 3, with reference to FIG. 3e, a second thermal annealing sub-process is carried out at a temperature higher than the annealing temperature of the first thermal annealing sub-process. As a result, the intermediate product (MSi$_Y$) is further silicidated into the metal silicide (MSi$_X$), i.e., the metal silicide layer 150, that has a higher silicon content than the intermediate product (MSi$_Y$) (i.e., X>Y).

In this embodiment, the second thermal annealing sub-process allows further silicidation of cobalt monosilicide (CoSi) or dicobalt silicide (CoSi$_{1/2}$) into cobalt disilicide (CoSi$_2$). The annealing temperature adopted in the second thermal annealing sub-process may range, for example, from 650 □ to 900 □. In an alternative embodiment, the second thermal annealing sub-process may be performed in an atmosphere of an inert gas such as, nitrogen (N$_2$), argon (Ar) or the like.

With particular reference to FIG. 3e, the resulting metal silicide layer 150 includes a first portion 151 embedded within the substrate 100 and a second portion 152 located above both the first portion 151 and the substrate 100. It will be appreciated that the first portion 151 of the metal silicide layer 150 has a thickness corresponding to an amount of the substrate consumed in the formation of the metal silicide layer. In other words, a consumed thickness, in a height direction, of the substrate 100 is equal or close to the thickness of the first portion 151.

Specifically, assuming the metal layer 130 has a first thickness and the first portion 151 of the metal silicide layer 150 has a second thickness, in this embodiment, a ratio of the first thickness to the second thickness may be made equal to or greater than 1:3.7. That is, the consumption of the substrate is equal to or less than 3.7 thickness units per thickness unit of the metal layer. Therefore, the method according to this embodiment allows an effective reduction in the consumption of the substrate and may even allow a thickness of the first portion 151 to be less than a thickness of the second portion 152.

Embodiment 2

In the semiconductor field, metal silicides are widely used in semiconductor devices. For example, during the fabrication of a transistor, a sacilide process is usually employed to form metal silicide layers as contact pads for the gate, source and drain of the transistor.

FIGS. 4a to 4e are schematic diagrams showing structures produced during the fabrication of a semiconductor device in a method according to a second embodiment of the present invention. The method according to this embodiment will be described in detail below with reference to these figures and with the semiconductor device containing a transistor as an example. The method according to this embodiment comprises the method for forming the metal silicide layer as described above.

Figure 4A:
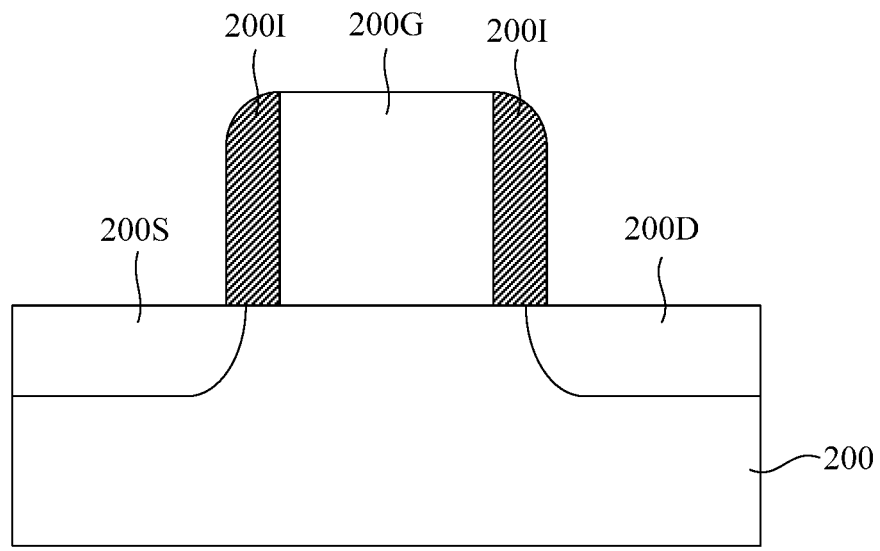
FIGS. 4a to 4f are schematic diagrams showing structures during the fabrication of a semiconductor device according to a second embodiment of the present invention.

At first, referring to FIG. 4a, a substrate 200 containing silicon is provided. On the substrate 200 is formed a transistor having a gate 200G, a source 200S and a drain 200D. Herein, since the transistor may have any conventional configuration, a detailed description thereof is omitted.

A material of the gate 200G of the transistor contains silicon which may be polycrystalline silicon. The gate 200G may have spacers 200I formed on side faces thereof for protection of the gate 200G In this embodiment, the transistor may be a transistor of the planar type (i.e., the gate 200G resides on the surface of the substrate). However, it will be appreciated that, in an alternative embodiment, the transistor may be a transistor of the trench type (i.e., the gate 200G is formed within the substrate).

Subsequently, a cleaning process is carried out to remove contaminants and native oxide layers on the surface of the substrate, and within 8 hours after the substrate is cleaned, a buffer layer 210 is deposited on the substrate 200.

The buffer layer 210 covers the surface of the transistor on the substrate in a shape conforming manner, such that the buffer layer 210 covers a top surface of the gate 200G, the spacers 200I, the source 200S and the drain 200D.

Figure 4B:
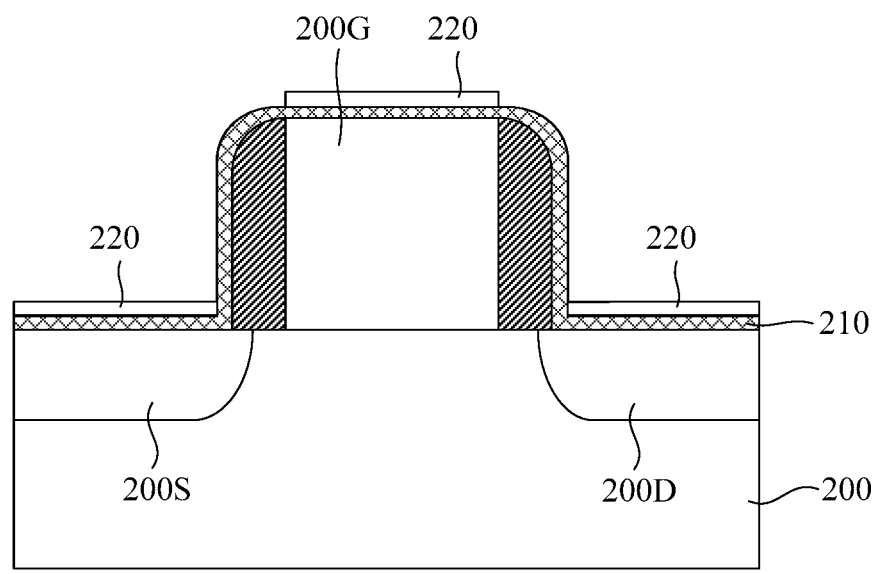

Afterward, as shown in FIG. 4b, a silicon layer 220 is deposited, which covers the gate 200Q the source 200S and the drain 200D of the transistor.

Specifically, the formation of the silicon layer 220 may for example include: depositing a thin film of silicon material over the substrate 200, which covers the gate 200Q spacers 200I, source 200S and drain 200D of the transistor in shape conformity; performing an etching process to remove the portion of the thin film over the spacers 200I, with the remainder of the thin film still covering the gate 200Q the source 200S and the drain 200D. The removal may be accomplished by a photolithography process in combination with a wet etching process. An etchant used in the wet etching process may include, for example, a mixture of hydrofluoric acid and nitric acid.

Figure 4C:
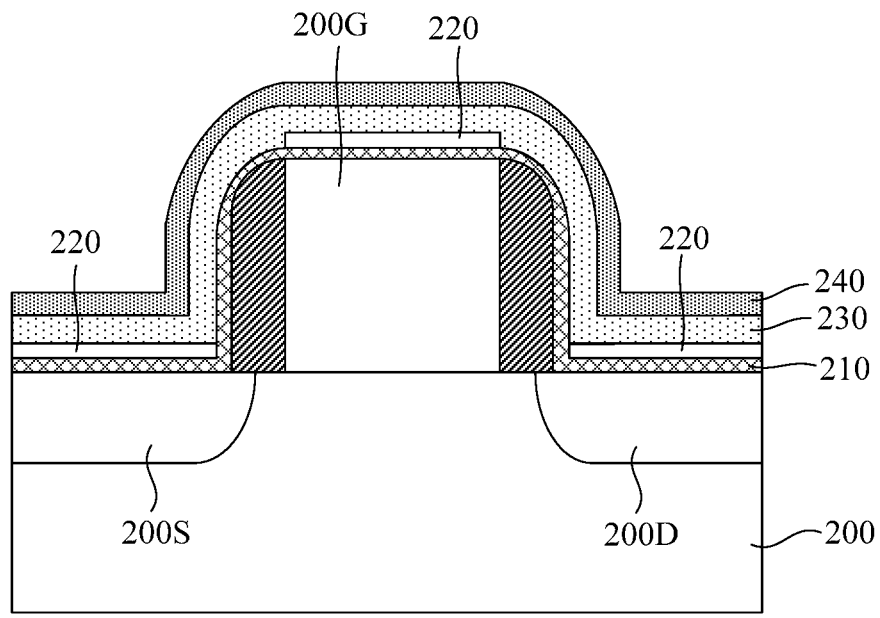

Thereafter, with reference to FIG. 4c, a metal layer 230 and a capping layer 240 are sequentially deposited above the substrate 200, each of which may cover the surface of the substrate in shape conformity.

Figure 4D:
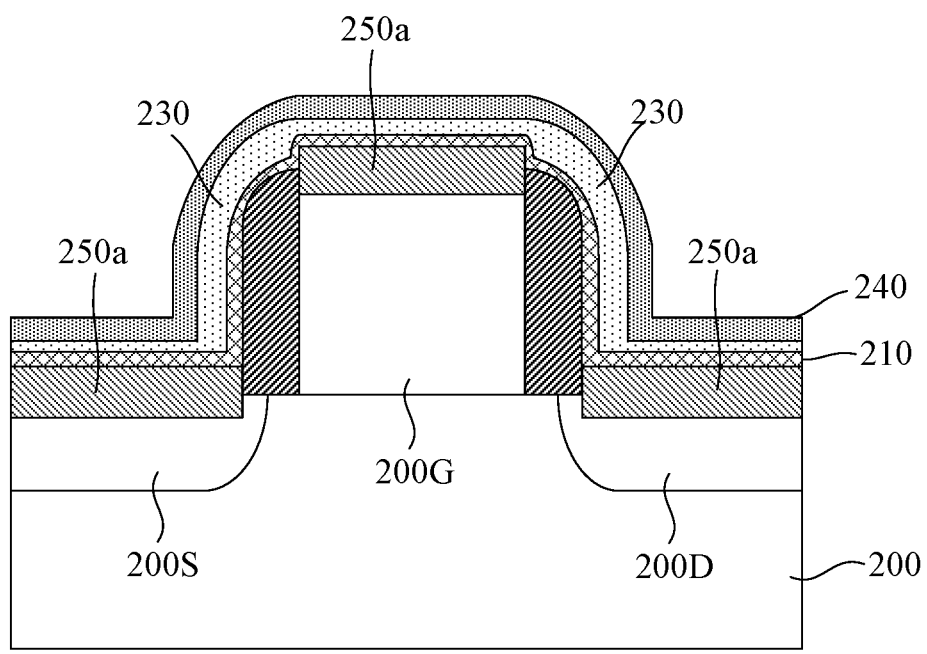

Next, with reference to FIG. 4d, a first thermal annealing sub-process is carried out to allow the metal in the metal layer 230 to react with silicon. As a result, an intermediate product layer 250a is produced, covering the gate 200Q the source 200S and the drain 200D of the transistor.

Specifically, in the first thermal annealing sub-process, the intermediate product layer 250a results from part of the metal in the metal layer 230 reacting with silicon in the silicon layer 220 and another part of the metal in the metal layer 230 that passes through the buffer layer 210 reacting with silicon in the substrate 200. Additionally, in this step, the buffer material in the buffer layer 210 can at least partially migrate above the intermediate product layer 250a.

Further, in specific embodiments, it is possible that part of the metal layer 230 does not react with silicon and remains above the buffer layer 210.

Figure 4E:
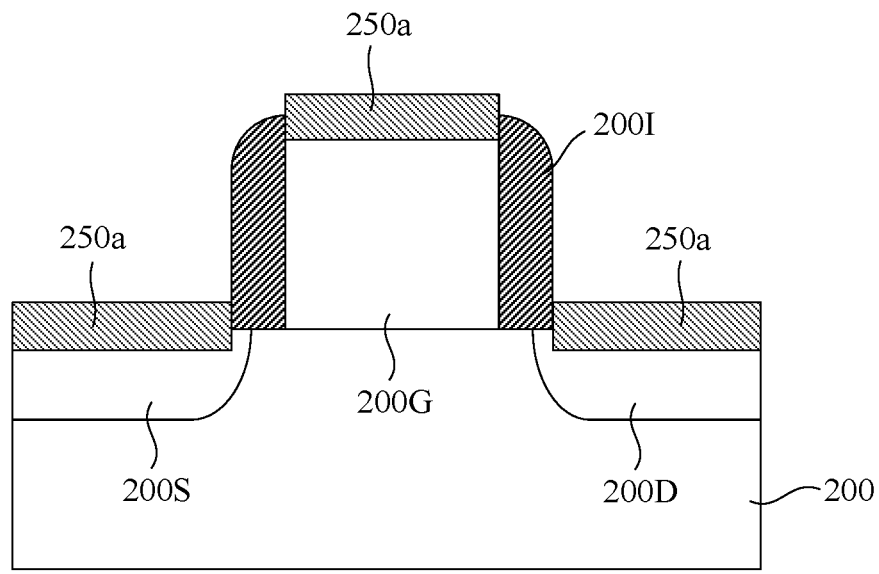

After that, with reference to FIG. 4e, the capping layer 240 and the buffer layer 210 that has migrated above the intermediate product layer 250a are removed. Additionally, this step may further include removing the remaining part of the metal layer 230 that has not reacted with silicon.

Figure 4F:
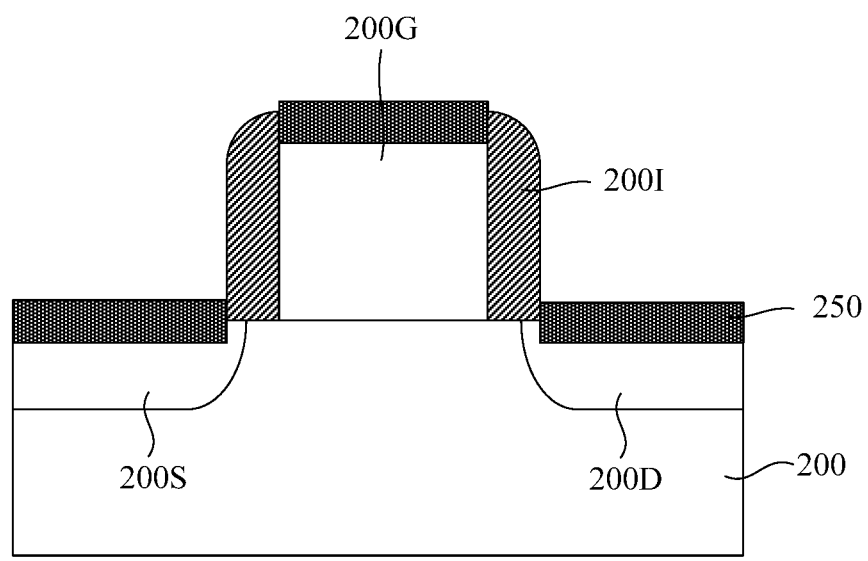

Following the removal step, with reference to FIG. 4f, a second thermal annealing sub-process is performed to further silicidate the intermediate product layer into a metal silicide layer 250.

With the above steps done, the metal silicide layer 250 is formed above each of the gate 200G, the source 200S and the drain 200D of the transistor. As described above in the first embodiment, the deposited buffer layer 210, the silicon layer 220 and the capping layer 240 are helpful in enhancing the quality and interface flatness of the metal silicide layer 250 and reducing the consumption of the substrate. In particular, with the case of this embodiment as an example, in which the metal silicide layer overlies the source 200S and the drain 200D each typically having a small thickness, the problem of substantial substrate consumption arising out of the use of the conventional method tends to lead to punch through in the source 200S and the drain 200D. In contrast, the method according to this embodiment can reduce the consumption of the substrate and hence ensure the normal performance of the transistor.

The semiconductor device made by the method as described above accordingly includes the substrate and the metal silicide layer thereon. In addition, there are residuals of the buffer material (e.g., conductive particles) in the metal silicide layer.

Further, the metal silicide layer in the semiconductor device accordingly includes a first portion within the substrate and a second portion above both of the first portion and the substrate. In an alternative embodiment, the first portion has a thickness that is less than a thickness of the second portion.

In summary, in the metal silicide layer formation method of the present invention, the buffer layer separates the metal layer from the substrate to avoid direct contact between them. With this buffer layer, the speed at which the metal diffuses from the metal layer into the substrate during the thermal annealing process can be controlled. As a result, the problem of agglomeration of the resulting metal silicide can be effectively mitigated thanks to a moderate diffusion rate of the metal within the substrate, the surface roughness of the resulting metal silicide layer can be reduced, and pinhole defects will be much less present in the substrate. In addition, in the semiconductor device fabricated based on this above metal silicide layer formation method, as both the top surface of the metal silicide layer and its interface with the substrate are flat, the resistance of the metal silicide layer and leakage currents therein are reduced.

The foregoing embodiments disclosed herein are described in a progressive manner, with the description of each embodiment focusing on its differences from the others. If any element of concern is not described in detail in a certain embodiment, reference can be made to any other embodiment for a detailed description of a similar or identical element.

The description presented above is merely that of a few preferred embodiments of the present invention and does not limit the scope thereof in any sense. Any and all changes and modifications made by those of ordinary skill in the art based on the above teachings fall within the scope as defined in the appended claims.

What is claimed is:

1. A method of forming a metal silicide layer, comprising:
providing a substrate, the substrate comprising silicon;
sequentially depositing a buffer layer and a metal layer over the substrate so that the buffer layer is sandwiched between the metal layer and the substrate; and
performing a thermal annealing process to allow metal atoms in the metal layer to diffuse through the buffer layer into the substrate and react with silicon in the substrate to form a metal silicide layer, wherein at least part of a buffer material in the buffer layer passes through the metal layer and migrates above the metal silicide layer.

2. The method of claim 1, further comprising, subsequent to the deposition of the buffer layer and prior to the deposition of the metal layer, depositing a silicon layer on the buffer layer, so that the metal layer is deposited on the silicon layer, wherein during the thermal annealing process, part of the metal atoms in the metal layer reacts with silicon in the silicon layer, while another part of the metal atoms in the metal layer diffuses into the substrate and reacts with the silicon in the substrate, so as to collectively form the metal silicide layer.

3. The method of claim 2, wherein the metal silicide layer comprises a first portion and a second portion, a first portion embedded within the substrate and the second portion located above both the first portion and the substrate, and wherein the metal layer has a first thickness and the first portion of the metal silicide layer has a second thickness, and wherein a ratio between the first thickness and the second thickness is equal to or greater than 1:3.7.

4. The method of claim 1, further comprising, subsequent to the deposition of the metal layer and prior to the performance of the thermal annealing process, depositing a capping layer on the metal layer, the capping layer being configured to isolate the metal layer from oxygen-containing particles.

5. The method of claim 4, wherein the capping layer comprises titanium nitride.

6. The method of claim 1, wherein the buffer layer comprises titanium which constitutes a titanium layer.

7. The method of claim 6, wherein the titanium layer in the buffer layer is doped with nitrogen ions.

8. The method of claim 7, wherein in the nitrogen-doped titanium layer in the buffer layer, a ratio between nitrogen atoms and titanium atoms is equal to or lower than 10%.

9. The method of claim 1, wherein the metal layer comprises cobalt, nickel or tantalum.

10. The method of claim 1, wherein performing the thermal annealing process to form the metal silicide comprises:

performing a first thermal annealing process to make the metal atoms in the metal layer to react with the silicon to form an intermediate product of the metal silicide, which constitutes an intermediate product layer; and performing a second thermal annealing process at an annealing temperature higher than an annealing temperature of the first thermal annealing process to further silicidate the intermediate product layer into the metal silicide layer, wherein the metal silicide layer has a silicon content higher than a silicon content of the intermediate product layer.

11. The method of claim 10, wherein during the first thermal annealing process, at least part of the buffer material in the buffer layer passes through the metal layer and migrates above the metal silicide layer, and wherein the method further comprises, subsequent to the first thermal annealing process, removing the buffer material that has migrated above the metal silicide layer.

12. The method of claim 10, wherein the annealing temperature of the first thermal annealing process ranges from 500° C. to 600° C.

13. The method of claim 10, wherein the annealing temperature of the second thermal annealing process ranges from 650° C. to 900° C.

14. The method of claim 1, wherein the buffer layer comprises a metal having a lattice structure.

15. A method of fabricating a semiconductor device, comprising forming a metal silicide layer using the method of claim 1.

16. The method of claim 15, wherein the semiconductor device comprises a transistor, and wherein the metal silicide layer is formed over a gate, a source and a drain of the transistor.

17. A semiconductor device fabricated by using the method of claim 15, comprising:

a substrate comprising silicon; and a metal silicide layer formed on the substrate and embedded therein with conductive particles.

* * * * *